United States Patent [19]
Lee et al.

[11] Patent Number: 5,680,062
[45] Date of Patent: Oct. 21, 1997

[54] GUNN TRANSCEIVER LOGIC INPUT CIRCUIT FOR USE IN A SEMICONDUCTOR MEMORY DEVICE

[75] Inventors: Young-dae Lee; Chul-min Jung, both of Seoul; Uk-rae Cho, Kyungki-do, all of Rep. of Korea

[73] Assignee: Samsung Electronics Co., Ltd., Suwon, Rep. of Korea

[21] Appl. No.: 625,112

[22] Filed: Apr. 1, 1996

[30] Foreign Application Priority Data

Mar. 31, 1995 [KR] Rep. of Korea ............... 95-7519

[51] Int. Cl.[6] ............................................. H03K 19/0175
[52] U.S. Cl. ................................. 326/63; 326/21; 326/86
[58] Field of Search ................................. 326/21, 31, 63, 326/66, 73, 77, 82, 83, 86

[56] References Cited

U.S. PATENT DOCUMENTS

| 5,023,488 | 6/1991 | Gunning | 326/86 |
|---|---|---|---|
| 5,111,080 | 5/1992 | Mizukami et al. | 326/30 |
| 5,122,691 | 6/1992 | Balakrishnan | 326/86 |
| 5,438,282 | 8/1995 | Kuo | 326/86 |
| 5,465,057 | 11/1995 | Takahashi | 326/66 |
| 5,528,171 | 6/1996 | Doi et al. | 326/66 |
| 5,576,639 | 11/1996 | Park | 326/66 |
| 5,576,642 | 11/1996 | Nguyen et al. | 326/86 |

*Primary Examiner*—David R. Hudspeth
*Attorney, Agent, or Firm*—Cushman Darby & Cushman, IP Group of Pillsbury Madison & Sutro LLP

[57] ABSTRACT

A gunn transceiver logic input circuit for use in a semiconductor memory device is capable of effectively inputting a signal having a small voltage difference. The gunn transceiver logic input circuit includes first and second input units which respectively input a GTL-level input signal and a GTL-level reference signal. First and second generating units with first and second level shifters respectively shift the GTL-level input signal and GTL-level reference signal to the ECL-level. An ECL buffer circuit compares the voltages between the ECL-level input signal and the ECL-level reference signal and generates first and second ECL-level output signals while maintaining a swing width of the GTL level signal.

10 Claims, 4 Drawing Sheets

5,680,062

GUNN TRANSCEIVER LOGIC INPUT CIRCUIT FOR USE IN A SEMICONDUCTOR MEMORY DEVICE

BACKGROUND OF THE INVENTION

1. Field of the Invention

The present invention relates to a signal input/output circuit, and more particularly to a gunn transceiver logic (hereinafter, referred to as GTL) input circuit.

2. Description of the Related Art

A GTL input circuit, which is intended for use in high speed (e.g., 225 MHz) memory devices, should have the following four input conditions: (1) signal input must be possible at high speeds, (2) gain and common mode rejection ratios should be high, (3) current consumption should be low, and (4) input offset should be low to recognize small swings in the GTL input signal. FIG. 1 shows a conventional GTL input circuit, as published in JEDEC standards.

As shown in FIG. 1, an input signal Vigt1 is applied to gate electrodes of PMOS transistors m1 and m2, and a reference voltage signal Vref is applied to the gate electrode of a PMOS transistor m3. A current difference occurs between current i1 and i2 flowing through NMOS transistors m4 and m5. These NMOS transistors serve as a current mirror in accordance with a voltage drop of the PMOS transistor m1 by the GTL input level and current limitation, which is generated as an output signal Vo.

In this device, however, there is a drawback if a logic "high" level at a source electrode of PMOS transistor m1 is lowered according to the input signal Vigt1, that operating speed of the circuit is reduced. Moreover, a voltage difference between two input signals Vigt1 and Vref capable of discriminating currents i1 and i2 flowing through the NMOS transistors m4 and m5 is large, and the saturation region between the two input signals Vigt1 and Vref is large.

Accordingly, the speed during which the output signal Vo is changed from a logic "low" level to a logic "high" level or from a logic "high" level to a logic "low" level is sensitive to the voltage difference of the input signals Vigt1 and Vref, which prevents more stable construction from being designed.

To overcome the above-described drawbacks in GTL input circuits, an emitter coupled logic (hereinafter, referred to as) ECL input buffer circuit can be used in a conventional semiconductor memory device. One such ECL input buffer circuit is shown in FIG. 2.

ECL input buffer circuits have several advantages over circuits such as the GTL input circuit of FIG. 1. First, the output signal of ECL input buffer circuits exhibit a constant speed Vo according to the voltage difference of input signals Vi and Vref. Second, the output signal Vo executes a small swing, and third, the common mode rejection ratio is relatively high.

However, GTL level signals cannot be directly used within the ECL input buffer circuit, but should be raised to ECL level signals using an input level medium.

SUMMARY OF THE INVENTION

Accordingly, it is an object of the present invention to provide a GTL input circuit for use in a semiconductor memory device which is capable of effectively inputting a signal having a small voltage difference.

It is another object of the present invention to provide a GTL input circuit for use in a semiconductor memory device which is capable of raising a GTL level signal, so that the GTL level signal may be applied to an ECL input buffer circuit.

It is still another object of the present invention to provide a GTL input circuit for use in a random access memory which is capable of raising a GTL level signal to an ECL level signal using a source follower and processing the output signal at a high speed through an ECL input buffer circuit, while maintaining a swing width of the GTL level signal.

To accomplish these and other objects, a GTL input circuit according to the present invention includes a first input unit which inputs a GTL level input signal, a second input unit which inputs a GTL level reference signal, a first generating unit having a first level shifter which shifts the GTL level input signal to a ECL level input signal, a second generating unit having a second level shifter, which shifts the GTL level reference signal to an ECL level reference signal, and an ECL buffer circuit which compares the voltages between the ECL level input signal and the ECL level reference signal and generates first and second ECL level output signals, while maintaining a swing width of the GTL level input signal.

BRIEF DESCRIPTION OF THE DRAWINGS ACCOMPANYING

The preferred embodiments of the present invention will now be described more specifically with reference to the attached drawings, wherein.

DETAILED DESCRIPTION OF THE PREFERRED EMBODIMENT

The following terms will be used in this application:

"A first input signal XAi" represents a GTL level input signal which swings from the voltages 0 V to 1.2 V ($V_{min}=$ 0 V, $V_{max}=1.2$ V), and from 0.4 V to 0.8 V ($V_{IL,min}=0.4$ V, $V_{IH,max}=0.8$ V), in AC test conditions.

"A first reference signal Vref" represents an external reference voltage for sensing the input of the first input signal XAi, which is fixed at a mid-voltage of the system I/O power.

"A second input signal GTLF" indicates the first input signal XAi raised to the ECL level.

"A second reference signal GTLBF" indicates the first reference signal Vref raised to the ECL level.

"A first output signal GTLS" indicates an ECL level output signal from the ECL buffer circuit.

"A second output signal GTLBS" indicates an ECL level output signal from the ECL buffer circuit, which is an inverse signal of the first output signal GTLS.

"A final first output signal GTL" indicates an output signal made by lowering the first output signal GTLS to a prescribed level.

"A final second output signal GTLB" indicates an output signal made by lowering the second output signal GTLBS to a prescribed level, which is an inverse signal of the final first output signal GTL.

"A current control signal Ref" represents an internal reference voltage for compensating temperature and process variations during driving of the reference voltage, which is applied to a given current source of a current control transistor of the ECL buffer circuit.

"A mode control signal ZZPD", represents a signal for saving current consumption according to the mode in which the circuit is operating. This signal preferably assumes as a low logic value during a normal mode and a high logic value during a standby mode.

A preferred semiconductor memory device according to the present invention will now be described with particular reference to FIG. 3.

Figure 1:
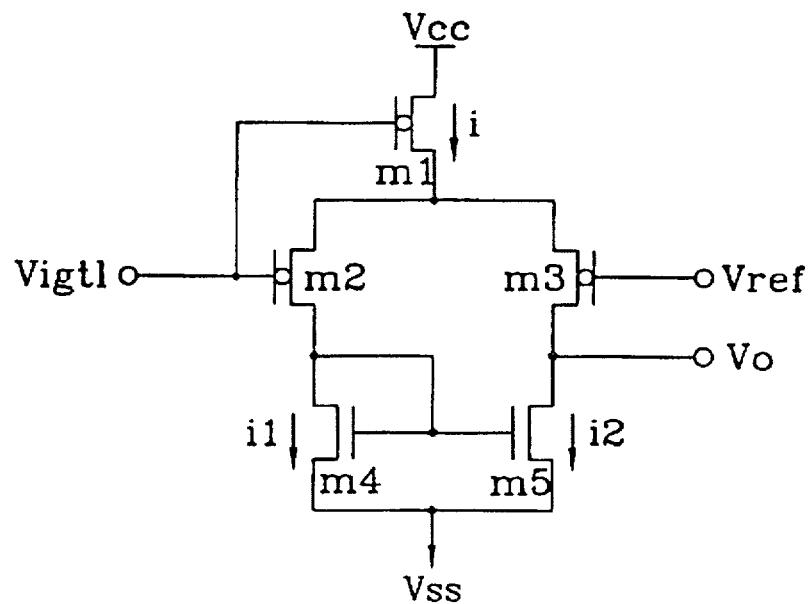
FIG. 1 is a circuit diagram illustrating a conventional GTL level signal input circuit for a semiconductor memory device.
Figure 2:
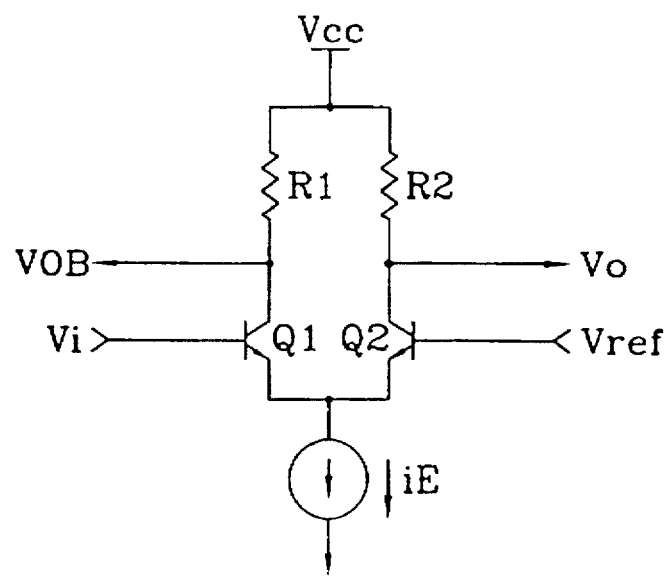
FIG. 2 is a circuit diagram illustrating a conventional ECL level signal input circuit for a semiconductor memory device.
Figure 3:
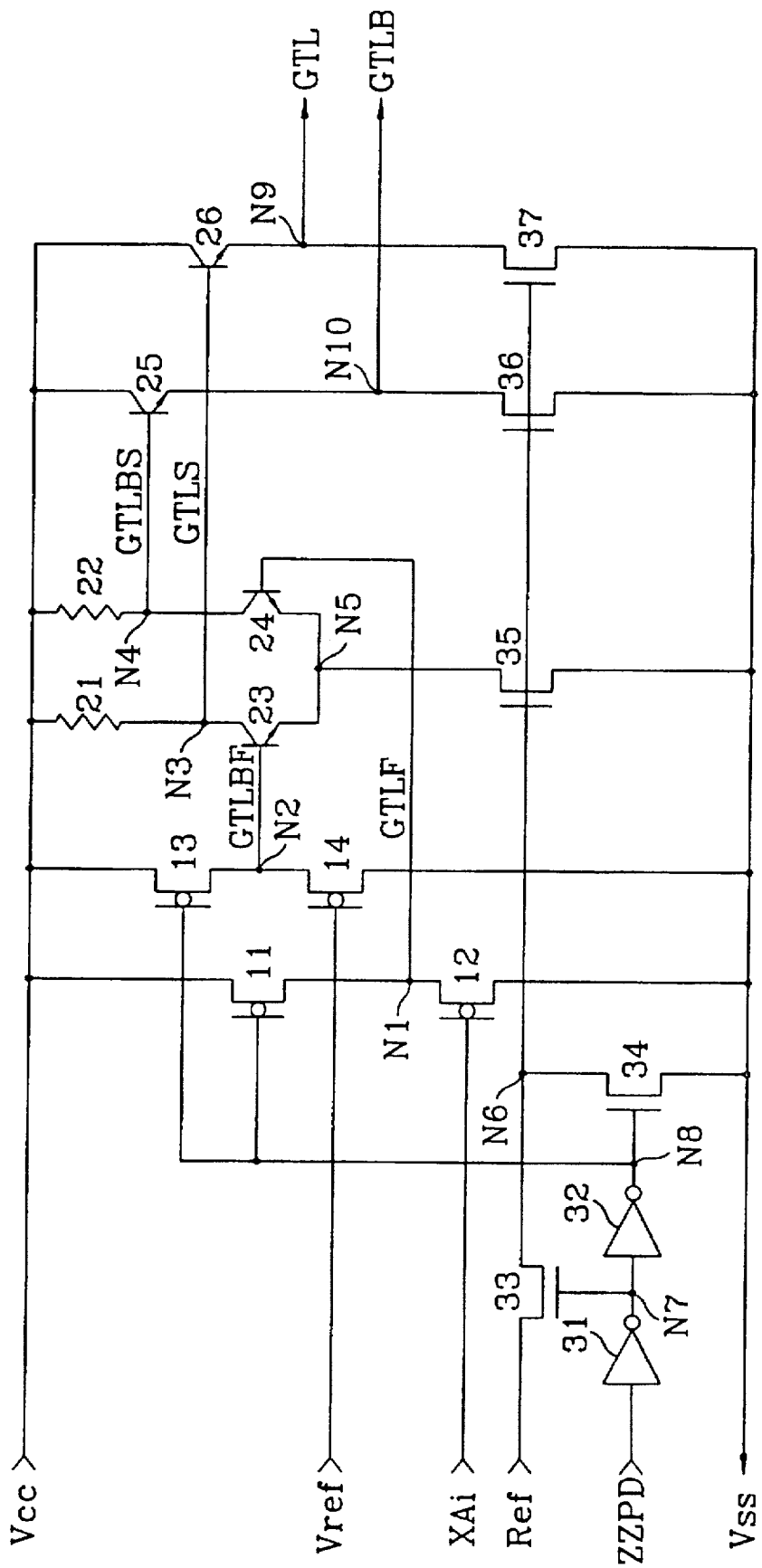
FIG. 3 is a circuit diagram illustrating a GTL level input circuit for a semiconductor memory device according to a preferred embodiment of the present invention.

As shown in FIG. 3, a PMOS transistor 11 is connected between a power supply voltage Vcc and a node N1 and has its gate electrode connected to a node N8. A PMOS transistor 12 is connected between the node N1 and a ground voltage Vss and has its gate electrode connected to a first input signal XAi. These PMOS transistors 11 and 12 function as a PMOS source follower to raise the first input signal XAi to an ECL level input signal GTLF, which is output at the node N1.

A PMOS transistor 13 is connected between the power supply voltage Vcc and a node N2 and has its gate electrode connected to the node NS. A PMOS transistor 14 is connected between the node N2 and the ground voltage Vss and has its gate electrode connected to a first reference signal Vref. These PMOS transistors 13 and 14 function as a PMOS source follower to raise the first reference signal Vref to an ECL level reference signal GTLBF, which is output at the node N2.

An inverter 31 inverts a mode control signal ZZPD to thereby output the inverted signal at a node N7. An inverter 32 is connected between the nodes N7 and N8 and inverts the signal of the node N7 to thereby output the inverted signal to the node N8. An NMOS transistor 33 is connected between an input terminal of a current control signal Ref and a node N6 and has its gate electrode connected to the node N7. An NMOS transistor 34 is connected between the node N6 and the ground voltage Vss and has its gate electrode connected to the node NS. This circuit controls input of the current control signal Ref according to the mode control signal ZZPD.

A first resistor 21 is connected between the power supply voltage Vcc and a node N3. A second resistor 22 is connected between the power supply voltage Vcc and a node A first bipolar transistor 23 is connected between the node N3 and a node N5 and has its base electrode connected to the node N2. A second bipolar transistor 24 is connected between the nodes N4 and N5 and has its gate electrode connected to the node N1. An NMOS transistor 35 is connected between the node N5 and the ground voltage Vss and has its base electrode connected to the node N6.

This circuit forms the ECL buffer circuit from which the ECL level output signals GTLS and GTLBS of are output according to the difference between the input signal GTLF at node N1 and the reference signal GTLBF at node N2.

The NMOS transistor 35 allows a constant current to flow according to the voltage level of the current control signal Ref input to the node N6.

A third bipolar transistor 25 is connected between the power supply voltage Vcc and a node N10 and has its base electrode connected to the node N4. An NMOS transistor 36 is connected between the node N10 and the ground voltage Vss and has its gate electrode connected to the node N6. A fourth bipolar transistor 26 is connected between the power supply voltage Vcc and the node N9 and has its base electrode connected to the node N3. An NMOS transistor 37 is connected between the node N9 and the ground voltage Vss and has its gate electrode connected to the node N6.

This circuit forms a generating unit which lowers the first and second output signals GTLS and GTLBS to prescribed levels and generates final first and second output signals GTL and GTLB, respectively. The NMOS transistors 36 and 37 allow a constant current to flow according to the voltage level of the current control signal Ref input to the node N6.

Figure 4:
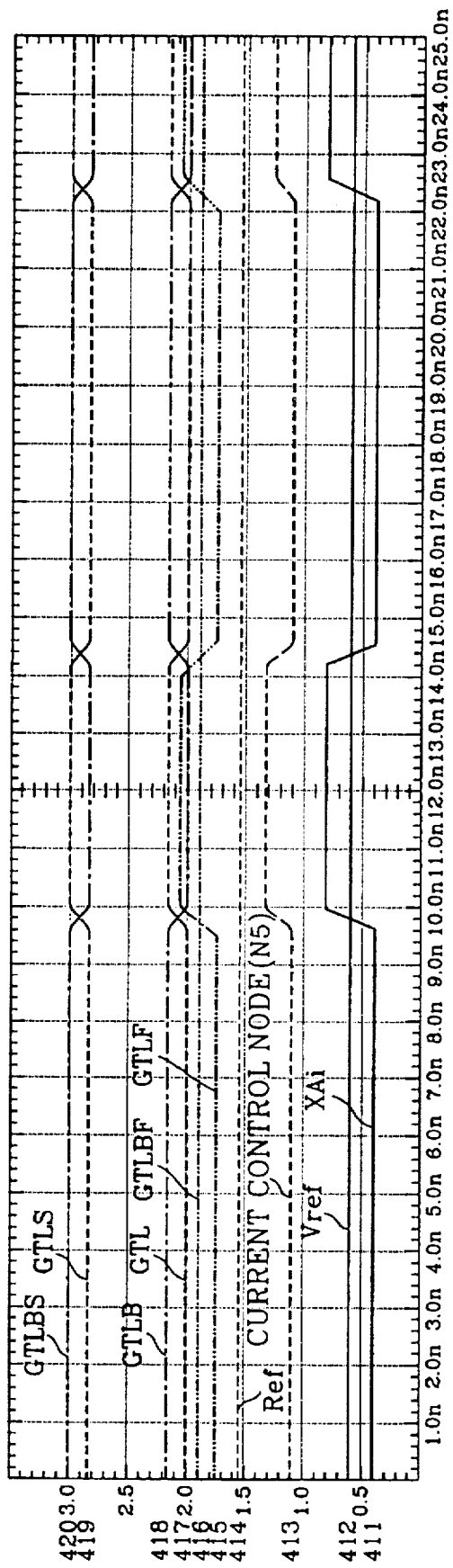
FIG. 4 is a first waveform diagram illustrating operational characteristic of each unit of FIG. 3.

FIG. 4 is a waveform diagram illustrating output characteristics of each node when the first input signal XAi is input as the GTL signal having a swing width from 0.4 V through 0.8 V to the device illustrated in FIG. 3. This waveform was simulated under the following conditions: power supply voltage Vcc=3.0 V, temperature=25° C., the swing width of the first input signal XAi=from 0.4 V through 0.8 V, and the mode control signal ZZPD=a low logic level.

Figure 5:
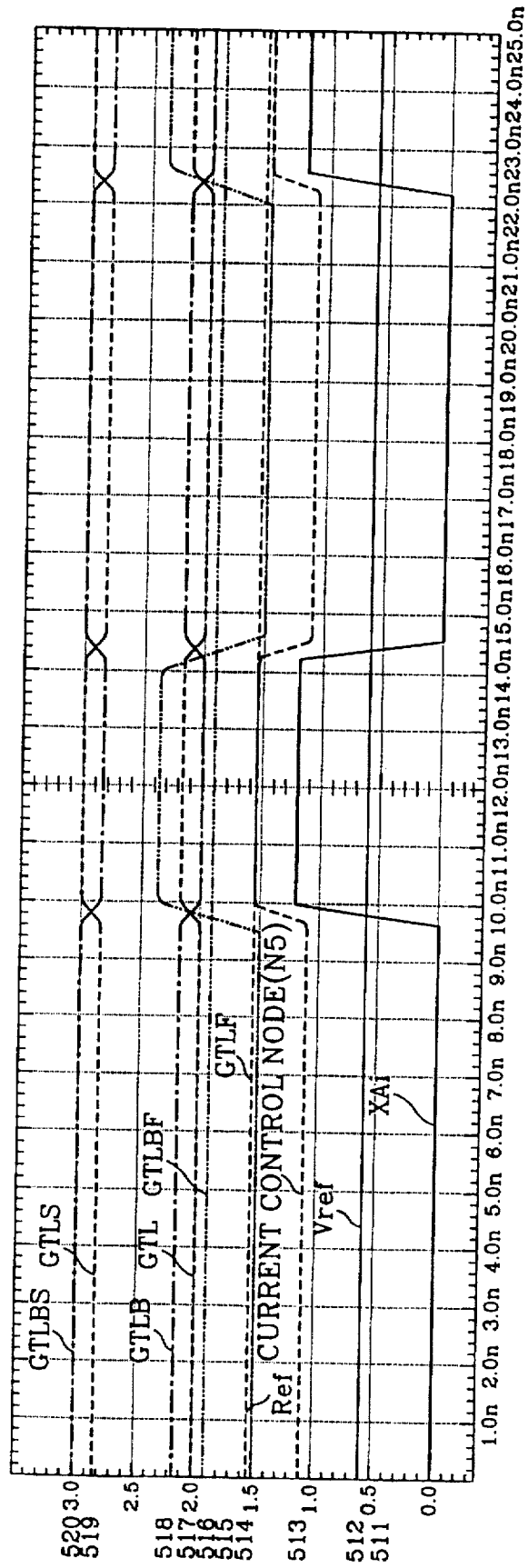
FIG. 5 is a second waveform diagram illustrating operational characteristic of each unit of FIG. 3.

FIG. 5 is a waveform illustrating an output characteristic of each node when the first input signal XAi is input as the GTL signal having a swing width from 0 V through 1.2 V to the device illustrated in FIG. 3. This waveform was simulated under the following conditions: power supply voltage Vcc=3.0 V, temperature=25° C., the swing width of the first input signal XAi=from 0 V through 1.2 V, and the mode control signal ZZPD=a low logic level.

Operation of the present invention will now be described in detail with particular reference to FIGS. 4 and 5.

During a normal mode, the mode control signal ZZPD is input as a low logic value. The inverter 31 inverts the mode control signal ZZPD to output a high logic value to the node N7, and the inverter 32 inverts the high logic value to output mode control signal ZZPD having a low logic value at the node N8. Therefore, the NMOS transistor 33 which has its gate electrode connected to the node N7 is turned ON and applies the current control signal Ref as shown by 414 of FIG. 4 to the node N6.

At the same time, NMOS transistor 34 is turned OFF to cut off the current path between the node N6 and the ground voltage Vss. Accordingly, the PMOS transistors 11 and 12 are turned ON by the logic "low" signal at the node NS, and act as resistors, so that the first input signal XAi as shown by 411 of FIG. 4 and the first reference signal Vref as shown by 412 of FIG. 4 are level-shifted to be thereby raised to ECL level signals. When the current control signal Ref is applied to the node N6, the NMOS transistors 35–37 are turned ON to determine an output potential of the nodes N3 and N4.

When the first GTL level input signal XAi, as shown by 411 of FIG. 4, is applied to the gate electrode of the PMOS transistor 12, conduction of the PMOS transistor 12 is determined according to the voltage level of the first input signal XAi. As a result, the second input signal GTLF at the node N1 is raised to the signal having the ECL level according to the channel resistance of the PMOS transistor 11 and the conduction state of the PMOS transistor 12.

Further, when the GTL level reference signal Vref, as shown by 412 of FIG. 4, is applied to the gate electrode of the PMOS transistor 14, conduction the PMOS transistor 14 is determined in accordance with the voltage level of the first reference signal Vref. Therefore, the second reference signal GTLBF at the node N2 is raised to an ECL level input signal depending on the channel resistance of the PMOS transistor 13 and the conduction state of the PMOS transistor 14.

The output of the source follower of the PMOS transistor, which allows the output level of the ECL buffer circuit having a constant current source to be constantly swung, can be defined as follows:

$$V(GTLF) = V(XAi) + |Vt| + \alpha 1 \quad (1)$$

$$V(GTLBF) = V(Vref) + |Vt| + \alpha 2 \quad (2)$$

wherein, $|Vt|+\alpha 1$ is the Vgs of the PMOS transistor 11, and $|Vt|+\alpha 2$ is the vgs of the PMOS transistor 13. $\alpha 1$ and $\alpha 2$ represent the Vgs increment components of the PMOS transistors 11 and 13 according to the current, and $\alpha 1$, $\alpha 1 < |Vt|$. Equation (2) is a reference voltage level of the ECL buffer circuit. Therefore, if the channel sizes of the PMOS transistors 11 and 12 and the PMOS transistors 13 and 14 are respectively adjusted, the GTL level signal can be adjusted to the input level of the ECL buffer circuit.

The first input signal XAi is raised to the voltage level as defined in equation (1) by the PMOS transistors 11 and 12, which is output at the node N1, as shown by 415 of FIG. 4. The level at the node N1 becomes an input signal level of the ECL buffer circuit.

The first reference signal Vref of the GTL level is raised to the voltage level as defined in equation (2) by the PMOS transistors 13 and 14, which is output at the node N2, as shown by 416 of FIG. 4. The level at the node N2 becomes an input signal level of the ECL buffer circuit.

Since the first and second bipolar transistors 23 and 24 of the ECL buffer circuit have their base electrodes respectively connected to the nodes N2 and N1, the ECL buffer circuit amplifies the voltage difference between the nodes N2 and N1. Then, the ECL buffer circuit generates the first output signal GTLS at the node N3 and the second output signal GTLBS at the node If the voltage level of the second input signal GTLF is higher than that of the second reference signal GTLBF, that is, $V(GTLF)-V(GTLBF) \geq 100$ mV, the second bipolar transistor 24 conducts more than the first bipolar transistor 23. At this time, the NMOS transistor 35 remains conductive by the current control signal Ref as shown by 414 of FIG. 4. The first bipolar transistor 23 becomes almost cut off and current flows through the second bipolar transistor 24. In this case, V(GTLS)=Vcc, and V(GTLBS)=Vcc-I·Rc, wherein current I flows through the NMOS transistor 35. Accordingly, the first output signal GTLS generated at the node N3 becomes a ECL level high logic signal and the second output signal GTLBS generated at the node N4 becomes a low logic signal having a low level by subtracting I·Rc from the power supply voltage Vcc.

On the other hand, if the voltage level of the second input signal GTLF is lower than the voltage level of the second reference signal GTLBF, that is, V(GTLBF)-V(GTLF) $\geq 100$ mV, the first bipolar transistor 23 conducts more than the second bipolar transistor 24. The second bipolar transistor 24 becomes almost cut off and current flows through the first bipolar transistor 23. In this case, V(GTLS)=Vcc-I·Rc, and V(GTLBS)=Vcc. Accordingly, the first output signal GTLS generated at the node N3 becomes a low level logic signal by subtracting I·Rc from the power supply voltage Vcc, and the second output signal GTLBS generated at the node N4 becomes an ECL level high logic signal.

The first output signal GTLS has a complementary logic level to the second output signal GTLBS. As shown by 419 and 420 of FIG. 4, the logic "high" level is raised and simultaneously the swing width becomes I·Rc, thereby having the GTL level swing width.

The first output signal GTLS generated at the node N3, as shown by 419 of FIG. 4, is applied to the base electrode of fourth bipolar transistor 26, and the second output signal GTLBS generated at the node N4, as shown by 420 of FIG. 4, is applied to the base electrode of third bipolar transistor 25. The NMOS transistors 36 and 37 maintain the conductive state according to the current control signal Ref as shown by 414 of FIG. 4. Therefore, the final first output signal GTL generated at the node N9 is lowered by as much as the voltage Vbe of the fourth bipolar transistor 26 and output as shown by 417 of FIG. 4.

At the same time, the second final output signal GTLB generated at the node N10 is lowered by as much as the voltage Vbe of the third bipolar transistor 25 and output as shown by 418 of FIG. 4. Thus, the swing width of the output signal is maintained and only the voltage level is lowered by a prescribed level.

The final first and second output signals GTL and GTLBS from the nodes N9 and N10 are applied to the circuit of the next stage and function as input signals. In these first and second final output signals, a common mode gain $$\left( \frac{\Delta Vout,a}{\Delta Vin,a} = Aa \right), \text{ a differential mode gain } \left( \frac{\Delta Vout,v}{\Delta Vin,v} = Av \right),$$

and common mode rejection ratio $$CMRR \left( \frac{Av}{Aa} \right)$$

have the ECL characteristic by their own structures. Accordingly, since a small GTL signal swing width is sufficiently amplified and ground noise is not generated, these output signals exhibit sufficient enough driving capability at speeds of more than 225 MHz and can be output to other terminals.

When the normal mode is completed and a standby mode is started, the mode control signal ZZPD is changed to the logic "high" signal. The inverter 31 outputs the logic "low" signal to the node N7, and the inverter 32 outputs the logic "high" signal to the node N8. Since the PMOS transistors 11 and 13 are turned OFF by the logic "high" signal at the node N8, the input paths of the first input signal XAi and the first reference signal Vref are cut off. Furthermore, since the NMOS transistor 33 is turned OFF and the NMOS transistor 34 is turned ON, the input path of the current control signal Ref is cut off, and, at the same time, the node N6 is connected to the ground voltage Vss. As a result, the node N6 is at the ground voltage Vss level, so that the NMOS transistors 35-37 are turned OFF and the operation of the ECL buffer circuit is stopped. Accordingly, in the standby mode, the operation of inputting the signal of the GTL level is stopped, thereby reducing unnecessary current consumption.

FIG. 5 is a waveform illustrating an output characteristic of each unit of FIG. 3 when the first input signal XAi is input as the GTL signal having a swing width from 0 V to 1.2 V, as shown in 511 of FIG. 5.

When the first input signal XAi shown by 511 of FIG. 5 and the first reference signal Vref shown by 512 of FIG. 5 are input, the voltage levels at the nodes N1 and N2 are raised to the second input signal GTLF and the second reference signal GTLBF as shown by 515 and 516 of FIG. 5, respectively. However, since the ECL buffer circuit amplifying the voltage difference of the two signals in which the gate electrode of the NMOS transistor 35 has a constant value of current control signal Ref, the current flowing through the NMOS transistor 35 is constant, as shown by 513 of FIG. 5. Accordingly, the first output signal GTLS and the second output signal GTLBS output at the nodes N3 and N4 are raised to the ECL level, as shown by 519 and 520 of FIG. 5, respectively, thereby maintaining the swing widths of the output signals to the GTL level. The remaining operational details are similar to those set forth above with respect to FIG. 4.

This application claims priority from Korean Application No. 7519/1995, the content of which is hereby incorporated by reference.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An input circuit, comprising:
 a first input unit for inputting an input signal of a first level as a first input signal having a swing width; a second input unit for inputting a reference signal of the first level as a first reference signal;
 a first generating unit having a first level shifter, for shifting the first input signal to a second input signal raised to a second level;
 a second generating unit having a second level shifter, for shifting the first reference signal to a second reference signal raised to the second level; and
 an input buffer circuit which inputs said second input signal and said second reference signal and generates first and second output signals raised to the second level in accordance with a difference between said second input signal and said second reference signal, while maintaining said swing width.

2. The input circuit as claimed in claim 1, wherein said first level is a gunn transceiver logic level, and said second level is an emitter coupled logic level.

3. A semiconductor memory device gunn transceiver logic input circuit, comprising:
 a first input unit for inputting a gunn transceiver logic level input signal having a swing width;
 a second input unit for inputting a gunn transceiver logic level reference signal;
 a first generating unit having a first level shifter, for shifting said gunn transceiver logic level input signal to an emitter coupled logic level to form an emitter coupled logic level input signal;
 a second generating unit having a second level shifter, for shifting said gunn transceiver logic level reference signal to the emitter coupled logic level to form an emitter coupled logic level reference signal; and
 an emitter coupled logic buffer circuit for comparing a difference between said emitter coupled logic level input signal and said emitter coupled logic level reference signal, and generating first and second output signals raised to the emitter coupled logic level, while maintaining said swing width.

4. The semiconductor memory device gunn transceiver logic input circuit as claimed in claim 3, wherein said first and second level shifters are used as loads in MOS transistor source followers.

5. The semiconductor memory device gunn transceiver logic input circuit as claimed in claim 3, wherein said swing width is from 0.4 V to 0.8 V and said gunn transceiver logic reference signal is a mid-voltage of system I/O power.

6. The semiconductor memory device gunn transceiver logic input circuit as claimed in claim 3, wherein said swing width is from 0 V to 1.2 V and said gunn transceiver logic reference signal is a mid-voltage of system I/O power.

7. A semiconductor memory device gunn transceiver logic input circuit, comprising:
 a first input unit for inputting a gunn transceiver logic level input signal having a swing width;
 a second input unit for inputting a gunn transceiver logic level reference signal;
 an input unit for inputting a mode control signal having a first logic level during a normal operation mode, and having a second logic level during a standby operation mode;
 a first generating unit having a first level shifter operated according to said mode control signal, for shifting said gunn transceiver logic level input signal to a emitter coupled logic level to form an emitter coupled logic level input signal;
 a second generating unit having a second level shifter operated according to said mode control signal, for shifting said gunn transceiver logic level reference signal to the emitter coupled logic level to form an emitter coupled logic level reference signal; and
 an emitter coupled logic buffer circuit for comparing a difference between said emitter coupled logic level input signal and said emitter coupled logic level reference signal, and generating first and second output signals raised to the emitter coupled logic level, while maintaining said swing width.

8. The semiconductor memory device gunn transceiver logic input circuit as claimed in claim 7, wherein
 said first level shifter comprises:
 a first connecting node for generating said emitter coupled logic level input signal;
 a first MOS transistor connected to a power supply voltage and said first connecting node and having a gate electrode connected to said mode control signal; and
 a second MOS transistor connected to said first connecting node and a ground voltage and having a gate electrode connected to said gunn transceiver logic input signal;
 whereby when said mode control signal of said first logic signal is input, said first MOS transistor is turned ON and said gunn transceiver logic input signal is shifted to form said emitter coupled logic level input signal, and when said mode control signal of said second logic signal is input, said first level shifter is turned OFF; and
 wherein said second level shifter comprises:
 a second connecting node for generating said emitter coupled logic level reference signal;
 a third MOS transistor connected to the power supply voltage and said second connecting node and having a gate electrode connected to said mode control signal; and
 a fourth MOS transistor connected to said second connecting node and the ground voltage and having a gate electrode connected to said first reference signal,
 whereby when said mode control signal of said first logic signal is input, said third MOS transistor is turned ON and said gunn transceiver logic reference signal is shifted to form said emitter coupled logic level reference signal, whereas when said mode control signal of said second logic signal is input, said second level shifter is turned OFF.

9. The input circuit as claimed in claim 8, wherein said swing width is from 0.4 V to 0.8 V and said gunn transceiver logic reference signal is a mid-voltage of system I/O power.

10. The input circuit as claimed in claim 8, wherein said swing width is from 0 V to 1.2 V and said gunn transceiver logic reference signal is a mid-voltage of system I/O power.

* * * * *